(12) United States Patent
Fan

(10) Patent No.: US 11,280,489 B2
(45) Date of Patent: Mar. 22, 2022

(54) LUMINOUS FAN

(71) Applicant: COOLER MASTER TECHNOLOGY INC., New Taipei (TW)

(72) Inventor: Shao-Dong Fan, Hui Zhou (CN)

(73) Assignee: COOLER MASTER TECHNOLOGY INC., New Taipei (TW)

( * ) Notice: Subject to any disclaimer, the term of this patent is extended or adjusted under 35 U.S.C. 154(b) by 30 days.

(21) Appl. No.: 17/205,835

(22) Filed: Mar. 18, 2021

(65) Prior Publication Data

US 2021/0207796 A1 Jul. 8, 2021

Related U.S. Application Data

(62) Division of application No. 16/015,647, filed on Jun. 22, 2018, now Pat. No. 10,989,405.

(30) Foreign Application Priority Data

Feb. 14, 2018 (CN) .......................... 201810151961.0
Apr. 3, 2018 (CN) .......................... 201810290160.2

(51) Int. Cl.
*F21V 33/00* (2006.01)
*F21V 7/00* (2006.01)
*F21V 17/12* (2006.01)
*H05K 7/20* (2006.01)
*F04D 29/00* (2006.01)
*G06F 1/20* (2006.01)
*F04D 19/00* (2006.01)
(Continued)

(52) U.S. Cl.
CPC ........ *F21V 33/0096* (2013.01); *F04D 19/002* (2013.01); *F04D 25/066* (2013.01); *F04D 29/005* (2013.01); *F21V 7/0091* (2013.01); *F21V 17/12* (2013.01); *G06F 1/20* (2013.01); *H05K 7/20172* (2013.01); *F21Y 2115/10* (2016.08); *G06F 2200/201* (2013.01)

(58) Field of Classification Search
CPC ........... H05K 7/20172; F04D 25/0613; F04D 29/005; F04D 29/526; F04D 29/00; F21V 33/0052; F21V 33/0096; F21V 23/005; G06F 1/20; F21Y 2103/33; F21Y 2107/10; F21Y 2115/10
See application file for complete search history.

(56) References Cited

U.S. PATENT DOCUMENTS

2011/0116234 A1* 5/2011 Ye .............................. G06F 1/20
 361/695
2012/0257999 A1* 10/2012 Hsieh ...................... F04D 29/64
 417/423.14
2017/0331346 A1* 11/2017 Lai ...................... F04D 25/0613

* cited by examiner

*Primary Examiner* — Fatima N Farokhrooz
(74) *Attorney, Agent, or Firm* — Maschoff Brennan

(57) ABSTRACT

The disclosure provides a luminous fan including a main body, a light guide member and a light source. The main body includes a fan frame and a plurality of propellers, and the plurality of propellers are rotatably mounted on the fan frame. The light guide member includes an outer light guide ring and a plurality of inner light guide rings, the plurality of inner light guide rings are mounted on the fan frame, the plurality of inner light guide rings each have an air channel, the plurality of propellers are respectively located in the air channels, the outer light guide ring is mounted on the plurality of inner light guide rings and surrounds the plurality of inner light guide rings, and the outer light guide ring is exposed from the luminous fan. The light source is disposed between the outer light guide ring and the inner light guide ring.

3 Claims, 2 Drawing Sheets

(51) Int. Cl.
*F04D 25/06* (2006.01)
*F21Y 115/10* (2016.01)

LUMINOUS FAN

CROSS-REFERENCE TO RELATED APPLICATIONS

This patent application is a divisional patent application of U.S. patent application Ser. No. 16/015,647 filed on Jun. 22, 2018 and entitled "LUMINOUS FAN AND LIGHT GUIDE MEMBER", which is a non-provisional application claims priority under 35 U.S.C. § 119(a) on Patent Application No(s). 201810151961.0 filed in China on Feb. 14, 2018, and Patent Application No(s). 201810290160.2 filed in China on Apr. 3, 2018, the entire contents of which are hereby incorporated by reference.

TECHNICAL FIELD

The disclosure relates to a luminous device, more particularly to a luminous fan.

BACKGROUND

With the popularity of personal computer and the development of information technology, the personal computer is not only used for work, but for creative leisure, educational purposes, entertainment, communication, or personal information management.

At present, there are various transparent computer casings in the market, by putting colored light sources, such as colored LEDs or lamps, into such casing could give the computer a colorful visual effect.

Usually, the colored light sources are mounted on the frame of the computer fan and being toward the propeller of the fan in order to turn the fan into a luminous fan.

However, the frame contains fasteners for assembling its upper and lower frame, and the fasteners are opaque and will block the light from the light sources. As a result, some of light is missing, so the desired visual effect is effected and the fan fails to create a complete ring-shaped illumination.

SUMMARY

Accordingly, the present disclosure provides a luminous fan in order to create a complete ring-shaped illumination at the interior or exterior of the luminous fan.

One embodiment of the disclosure provides a luminous fan including a main body, a light guide member and at least one light source. The main body includes a fan frame and a plurality of propellers, and the plurality of propellers are rotatably mounted on the fan frame. The light guide member includes an outer light guide ring and a plurality of inner light guide rings, the plurality of inner light guide rings are mounted on the fan frame, the plurality of inner light guide rings each have an air channel, the plurality of propellers are respectively located in the air channels, the outer light guide ring is mounted on the plurality of inner light guide rings and surrounds the plurality of inner light guide rings, and the outer light guide ring is exposed from the luminous fan. The at least one light source is disposed between the outer light guide ring and the inner light guide ring.

According to the luminous fan thereof as discussed in above, regardless of whether the outer light guide ring is made of one piece or consisted of a multiple of components, the outer light guide ring surrounds the fan frame and the mounting part of the light guide member (that is, the distance between the first ring-shaped illuminating surface and the rotation axis is larger than the distance between a side of the first mounting part away from the rotation axis and the rotation axis), such that the ring-shaped illuminating surface of the outer light guide ring is not blocked by the mounting part, ensuring to create a complete annulus of light (or a ring-shaped illumination) and an annular halo at the exterior of the luminous fan and thereby improving the visual effect of the luminous fan.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
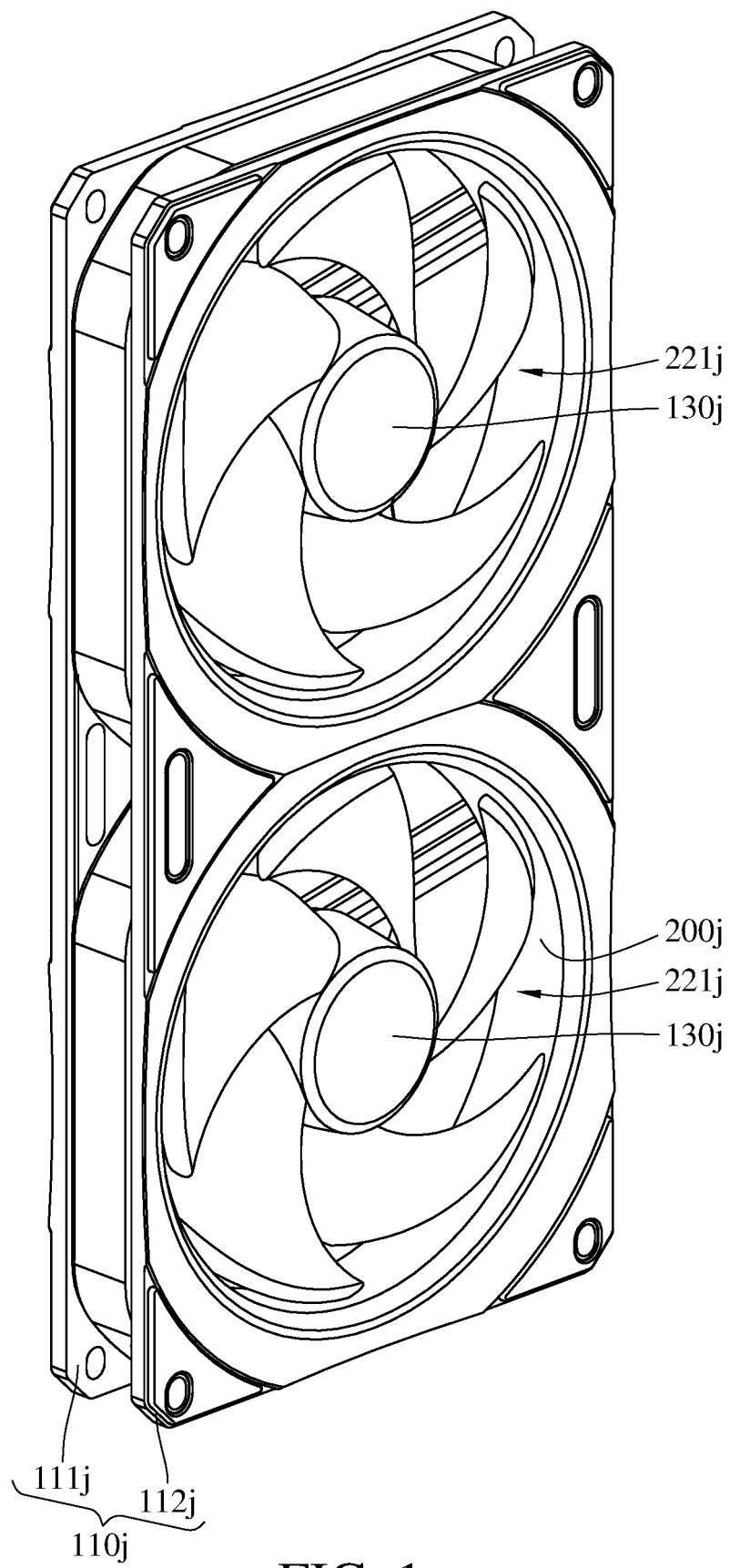
FIG. 1 is a cross-sectional view of a luminous fan according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

Figure 2:
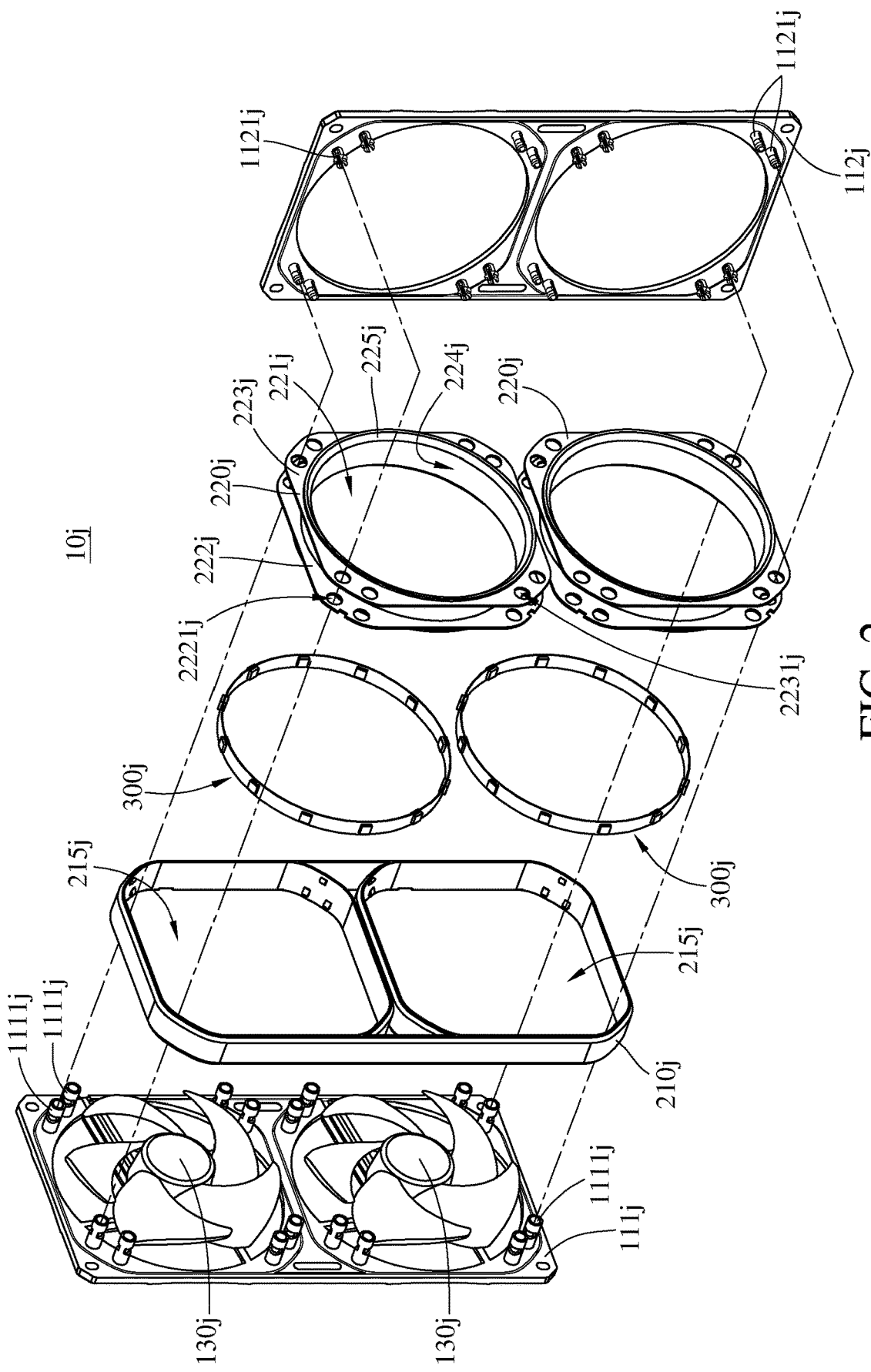
FIG. 2 is an exploded view of the luminous fan in FIG. 1.

Then, please refer to FIGS. 1 and 2, FIG. 1 is a cross-sectional view of a luminous fan according to a first embodiment of the disclosure, and FIG. 2 is an exploded view of the luminous fan in FIG. 1.

In this embodiment, a luminous fan 10j includes a first carrier board 111j, two propellers 130j, a second carrier board 112j, a light guide member 200j and two light sources 300j.

The first carrier board 111j has a plurality of first mounting parts 1111j. The first mounting parts 1111j are, for example, mounting components for being detachably mounted to the second carrier board 112j. The second carrier board 112j has a plurality of first mounting parts 1121j. The first mounting parts 1121j are mounting components compatible with and able to be fixed to the first mounting parts 1111j. That is, the first mounting parts 1121j are able to be detachably engaged with the first mounting parts 1111j so as to mount the first carrier board 111j onto the second carrier board 112j to constitute the fan frame 110j. The light guide member 200j can be mounted on the fan frame 110j, but the detail would be described in the following paragraphs. In this embodiment, the fan frame 110j is constituted of two plate pieces, but the present disclosure is not limited thereto. In some other embodiments, the fan frame may be made of one piece or constituted of more than three plate pieces. In addition, there may be one or more buffering pads disposed on the fan frame in order to reduce the operation vibration.

The light guide member 200j includes an outer light guide ring 210j and two inner light guide rings 220j. The outer light guide ring 210j is mounted on the fan frame 110j via the inner light guide rings 220j. In detail, the outer light guide ring 210j has two through holes 215j, such that the outer light guide ring 210j is an 8-shaped object. The outer light guide ring 210j is mounted on the two inner light guide rings 220j, and the two inner light guide rings 220j are respectively aligned with and disposed in the two through hole 215j. It is noted that the outer light guide ring 210j and the inner light guide rings 220j are mounted in the way the
} same as the previous embodiments, so the repetitive details are omitted for simplicity. The inner light guide rings 220j each have an outer surface and an inner surface, the inner surface forms an air channel 221j which is circular. The inner light guide rings 220j each include a first position-limiting plate 222j and a second position-limiting plate 223j at either side. The first position-limiting plate 222j and the second position-limiting plate 223j radially extend. The first position-limiting plate 222j has a plurality of second mounting parts 2221j, and the second position-limiting plate 223j has a plurality of second mounting parts 2231j. The second mounting parts 2221j and 2231j are, for example, through bores, and are respectively located at four corners of the inner light guide rings 220j. The second mounting parts 2221j and 2231j are respectively for the insertions of the first mounting parts 1111j and 1121j so as to be mounted on the fan frame 110j.

The two propellers 130j are both mounted on the first carrier board 111j. The two inner light guide rings 220j are both mounted on the first carrier board 111j and respectively surround the two propellers 130j. The first carrier board 111j, the second carrier board 112j and the inner light guide rings 220j are mounted together. It is noted that the first carrier board 111j, the second carrier board 112j and the inner light guide rings 220j are mounted in the way the same as the previous embodiments, so the repetitive details are omitted for simplicity, and the following paragraphs only illustrate the differences between these embodiments.

Also, the quantity of the propellers 130j in the luminous fan 10j is not restricted. In some other embodiments, the luminous fan may include more than three propellers, and the propellers may be arranged in a line or an array.

Each of the light source 300j is disposed between the outer light guide ring 210j and the inner light guide rings 220j.

The main purpose of the present disclosure is to create a complete annulus of light (or a ring-shaped illumination) and an annular halo at the exterior of the luminous fan. As can be seen from the above embodiments, there are numerous implementable embodiments that can achieve the main purpose of the present disclosure, thus the inventor only lists a few that are distinctive, but the present disclosure is not limited thereto. Those skilled in the art can combine the technical features mentioned in the present disclosure according to their requirements. For example, the first mounting part and the second mounting part may be made of a material permeable to light to allow the light from the first ring-shaped illuminating surface to pass through; to modify the shape of the main body as long as it does not block the emitting light from the first ring-shaped illuminating surface (that is, the main body is located out of a range of the emitting light from the first ring-shaped illuminating surface).

According to the luminous fan and the light guide member thereof as discussed in above, regardless of whether the outer light guide ring is made of one piece or consisted of a multiple of components, the outer light guide ring surrounds the fan frame and the mounting part of the light guide member (that is, the distance between the first ring-shaped illuminating surface and the rotation axis is larger than the distance between a side of the first mounting part away from the rotation axis and the rotation axis), such that the ring-shaped illuminating surface of the outer light guide ring is not blocked by the mounting part, ensuring to create a complete annulus of light (or a ring-shaped illumination) and an annular halo at the exterior of the luminous fan and thereby improving the visual effect of the luminous fan.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A luminous fan, comprising:
    a main body, comprising a fan frame and a plurality of propellers, and the plurality of propellers rotatably mounted on the fan frame;
    a light guide member, comprising an outer light guide ring and a plurality of inner light guide rings, the plurality of inner light guide rings mounted on the fan frame, the plurality of inner light guide rings each having an air channel, the plurality of propellers respectively located in the air channels, the outer light guide ring mounted on the plurality of inner light guide rings and surrounding the plurality of inner light guide rings, and the outer light guide ring exposed from the luminous fan; and
    at least one light source, disposed between the outer light guide ring and at least one of the plurality of inner light guide rings.

2. The luminous fan according to claim 1, wherein the fan frame comprising a first carrier board and a second carrier board, the first carrier board and the second carrier board each have a plurality of first mounting parts, the inner light guide rings each have a plurality of second mounting part, the plurality of first mounting parts of the first carrier board and the plurality of first mounting parts of the second carrier board are connected, the plurality of first mounting parts of the first carrier board or the plurality of first mounting parts of the second carrier board are respectively connected to the plurality of second mounting parts, the outer light guide ring is mounted on the inner light guide rings and surrounds the plurality of first mounting parts and the plurality of second mounting parts.

3. The luminous fan according to claim 2, wherein the plurality of first mounting parts are mounting protrusions, the plurality of second mounting parts are through bores, the plurality of first mounting parts of the first carrier board or the plurality of first mounting parts of the second carrier board are respectively disposed through the plurality of second mounting parts.

* * * * *